(12) United States Patent
Mun et al.

(10) Patent No.: US 12,087,792 B2
(45) Date of Patent: Sep. 10, 2024

(54) SUPPRESSED CROSS-TALK PIXEL-ARRAY SUBSTRATE AND FABRICATION METHOD

(71) Applicant: OmniVision Technologies, Inc., Santa Clara, CA (US)

(72) Inventors: Seong Yeol Mun, Santa Clara, CA (US); Bill Phan, San Jose, CA (US); Duli Mao, Sunnyvale, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 419 days.

(21) Appl. No.: 17/572,413

(22) Filed: Jan. 10, 2022

(65) Prior Publication Data
US 2023/0223416 A1 Jul. 13, 2023

(51) Int. Cl.
*H01L 27/146* (2006.01)

(52) U.S. Cl.
CPC .. *H01L 27/14623* (2013.01); *H01L 27/14685* (2013.01); *H01L 27/14605* (2013.01); *H01L 27/14621* (2013.01); *H01L 27/14627* (2013.01)

(58) Field of Classification Search
CPC ......... H01L 27/14623; H01L 27/14685; H01L 27/14605; H01L 27/14621; H01L 27/14627; H01L 27/1463; H01L 27/1464; H01L 27/14645; H01L 27/14689; H01L 27/14643; H01L 27/14683
See application file for complete search history.

(56) References Cited

U.S. PATENT DOCUMENTS

| | | | |
|---|---|---|---|
| 10,411,063 B2 | 9/2019 | Yang et al. | |
| 2016/0049439 A1 | 2/2016 | Yanagita et al. | |
| 2021/0104560 A1 | 4/2021 | Lee | |
| 2021/0143197 A1 | 5/2021 | Jung | |
| 2021/0202546 A1 | 7/2021 | Liu et al. | |
| 2021/0377481 A1* | 12/2021 | Hsieh | H01L 27/1464 |
| 2022/0208827 A1 | 6/2022 | Mun | |

OTHER PUBLICATIONS

Definition of 'annulus' downloaded from URL https://www.merriam-webster.com/dictionary/annulus (Year: 2024).*

* cited by examiner

*Primary Examiner* — J. E. Schoenholtz
(74) *Attorney, Agent, or Firm* — COZEN O'CONNOR

(57) ABSTRACT

A reduced cross-talk pixel-array substrate includes a semiconductor substrate, a buffer layer, a metal annulus, and an attenuation layer. The semiconductor substrate includes a first photodiode region. A back surface of the semiconductor substrate forms a trench surrounding the first photodiode region in a cross-sectional plane parallel to a first back-surface region of the back surface above the first photodiode region. The buffer layer is on the back surface and has a feature located above the first photodiode region with the feature being one of a recess and an aperture. The metal annulus is on the buffer layer and covers the trench. The attenuation layer is above the first photodiode region.

20 Claims, 8 Drawing Sheets

1100

1110
Form a feature in a buffer layer located on a surface of a semiconductor substrate above a first photodiode region, the semiconductor substrate including a trench surrounding the first photodiode region, the feature being one of a recess and an aperture.

1120
Form an attenuation layer between an incident light directed toward the first photodiode region and the first photodiode region.

1130
Form a metal annulus above the trench surrounding the first photodiode region.

1140
Deposit a first color filter material on the attenuation layer on the feature above the first photodiode region.

1150
Deposit a second color filter material on the buffer layer above a second photodiode region adjacent to the first photodiode region.

FIG. 11

SUPPRESSED CROSS-TALK PIXEL-ARRAY SUBSTRATE AND FABRICATION METHOD

BACKGROUND

Camera modules in commercial products such as stand-alone digital cameras, mobile devices, automotive components, and medical devices include an image sensor. The image sensor includes multiple pixels forming a pixel array, often also include at least one of multiple microlenses forming a microlens array, and multiple color filters forming a color-filter array located between the pixel array and the microlens array. Each color filter of the color filter array is aligned to a respective pixel of the pixel array. Similarly, each microlens of the microlens array is aligned to a respective pixel of the pixel array. Images produced by image sensors often include artifacts resulting from either electrical or optical sources. Optical cross-talk is one such artifact and refers to light detected by a first pixel of the pixel array after having propagated through a microlens and/or a color filter aligned to a second pixel of the pixel array. One source of optical cross-talk occurs when the incident light propagates through the microlens at a sufficiently high incident angle with respect to a surface-normal of the pixel array.

SUMMARY OF THE EMBODIMENTS

Embodiments disclosed herein reduce optical cross-talk by preventing the aforementioned source of cross-talk. In a first aspect, a reduced cross-talk pixel-array substrate includes a semiconductor substrate, a buffer layer, a metal annulus, and an attenuation layer. The semiconductor substrate includes a first photodiode region. A back surface of the semiconductor substrate forms a trench surrounding the first photodiode region in a cross-sectional plane parallel to a first back-surface region of the back surface above the first photodiode region. The buffer layer is on the back surface and has a feature located above the first photodiode region. The feature is one of a recess and an aperture. The metal annulus is on the buffer layer and covers the trench. The attenuation layer is above the first photodiode region.

In a second aspect, a method for fabricating a reduced cross-talk pixel-array substrate includes (i) forming a feature in a buffer layer located above a first photodiode region of a semiconductor substrate that includes a trench surrounding the first photodiode region, the feature being one of a recess and an aperture; (ii) forming an attenuation layer that includes a center section above the first photodiode region, a middle section surrounding the center section, and an outer section above the buffer layer; and (iii) forming a metal annulus above the trench surrounding the first photodiode region.

BRIEF DESCRIPTION OF THE FIGURES

FIG. 11 is a flowchart illustrating a method for fabricating the pixel-array substrate of FIG. 3, in an embodiment.

DETAILED DESCRIPTION OF THE EMBODIMENTS

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

Spatially relative terms, such as "beneath," "below," "lower," "under," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the terms "below" and "under" may encompass both an orientation of above and below. The device may be otherwise oriented (rotated ninety degrees or at other orientations) and the spatially relative descriptors used herein interpreted accordingly. In addition, it will also be understood that when a layer is referred to as being "between" two layers, it may be the only layer between the two layers, or one or more intervening layers may also be present.

The term semiconductor substrate may refer to substrates formed of one or more semiconductors such as silicon, silicon-germanium, germanium, gallium arsenide, indium gallium arsenide, silicon carbide, any other alloys formed of III-V compounds, and other semiconductor materials known to those of skill in the art. The term semiconductor substrate may also refer to a substrate, formed of one or more semiconductors, subjected to previous process steps that form regions and/or junctions in the substrate. A semiconductor substrate may also include various features, such as doped and undoped semiconductors, epitaxial layers of silicon, and other semiconductor structures formed upon the substrate.

Throughout this specification, several terms of art are used. These terms are to take on their ordinary meaning in the art from which they come, unless specifically defined herein or the context of their use would clearly suggest otherwise. It should be noted that element names and symbols may be used interchangeably through this document (e.g., Si vs. silicon); however, both have identical meanings.

Figure 1:
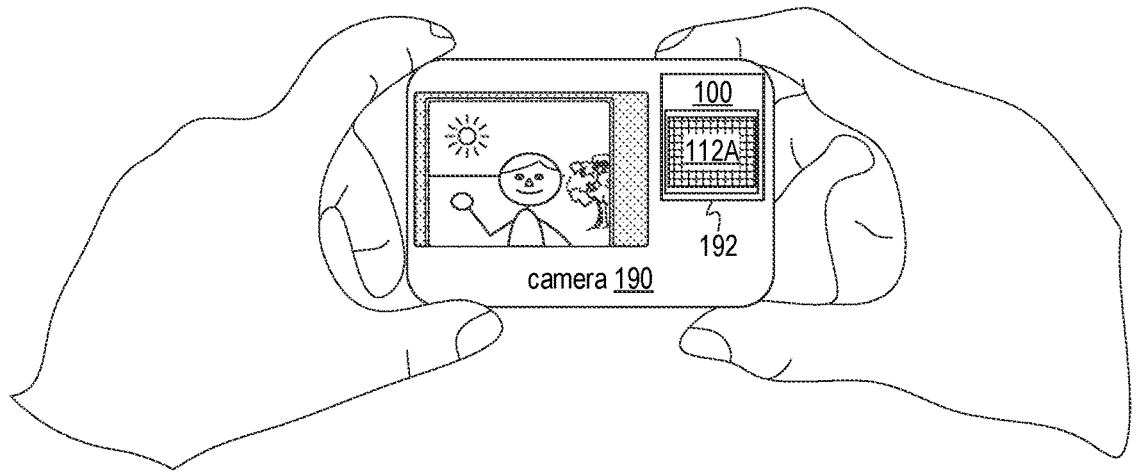
FIG. 1 depicts a camera imaging a scene.

FIG. 1 depicts a camera 190 imaging a scene. Camera 190 includes an image sensor 192, which includes a pixel-array substrate 100. Constituent elements of pixel-array substrate 100 may include at least one of silicon and germanium. Pixel-array substrate 100 includes a pixel array 112A. Image sensor 192 may be part of a chip-scale package or a chip-on-board package.

Figure 2:
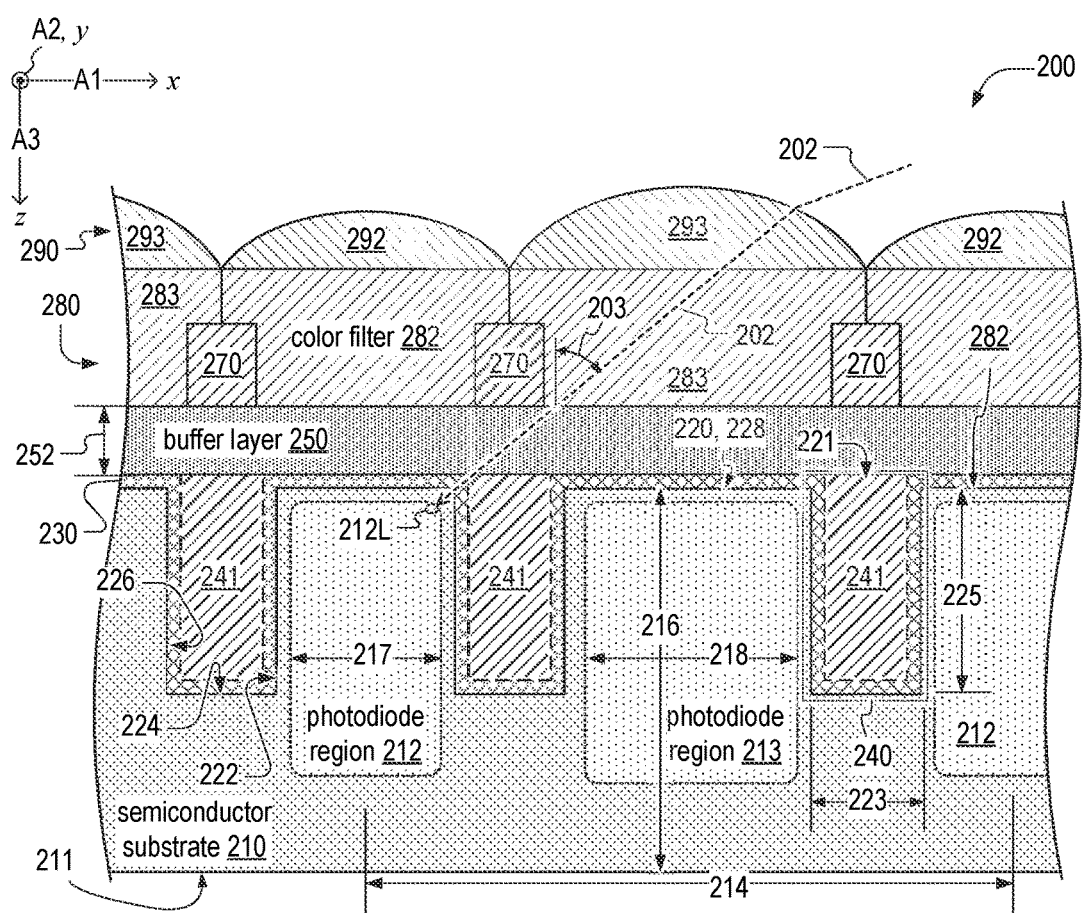
FIG. 2 cross-sectional schematic of a pixel-array substrate, which is an embodiment of a pixel-array substrate of the camera of FIG. 1.

FIG. 2 is a cross-sectional schematic of a pixel-array substrate 200, which is an example of pixel-array substrate 100. The pixel-array substrate 200 may be part of an image sensor. The cross-section illustrated in FIG. 2 is parallel to a plane, hereinafter the x-z plane, formed by orthogonal axes A1 and A3, which are each orthogonal to an axis A2. Herein, the x-y plane is formed by orthogonal axes A1 and A2, and planes parallel to the x-y plane are referred to as transverse planes. Unless otherwise specified, heights of objects herein refer to the object's extent along axis A3. Herein, a reference to an axis x, y, or z refers to axes A1, A2, and A3 respectively. Also, herein, each of a horizontal plane and a horizontal direction is parallel to the x-y plane, a width refers to an object's extent along the x and/or y axis, and a vertical direction is along the z axis.

Pixel-array substrate 200 includes a semiconductor substrate 210, a passivation layer 230, a buffer layer 250, a plurality of metal annuluses 270, and a color filter array 280. The plurality of metal annuluses 270 and color filter array 280 are on buffer layer 250. Pixel-array substrate 200 also includes a microlens array 290 that includes a plurality of microlenses 292 and 293. Each microlens 292 is aligned to a respective photodiode region 212 for directing incident light (e.g., incident image light) thereto. Each microlens 293 is aligned to a respective photodiode region 213 for directing incident light thereto.

Semiconductor substrate 210 includes one or more photosensitive or photodiode regions 212 and 213 arranged in an array form. In embodiments, one of photodiode regions 212 and adjacent photodiode region 213 form a high dynamic range imaging pixel in a pixel array for an image sensor. In embodiments, photodiode region 212 may be referred as a first photodiode region and photodiode region 213 may be referred as a second photodiode region. In embodiments, photodiode region 212 includes a first photodiode having a first full well capacity that is smaller than a second full well capacity of a second photodiode included in photodiode region 213. Full well capacity (FWC) refers to an amount of charges or electrons that a photodiode can accumulate before it reaches saturation. In other words, the second photodiode in photodiode region 213 may have larger charge accumulation capacity or storage and be able to store more photo-generated charges than the first photodiode in photodiode region 212. Each of first and second photodiodes may be formed of conductive type opposite to the semiconductor substrate 210. Each of first and second photodiodes may be a pinned photodiode.

Additionally, in embodiments, photodiode region 213 has a larger light sensing region than photodiode region 212. In embodiments, the photodiode region 212 has a first light sensing region having a width that is less than a width of a second light sensing region of the photodiode region 213. For example, photodiode regions 212 and 213 have respective widths 217 and 218, for example along A1 direction. In embodiments, width 218 exceeds width 217. In embodiments, width 217 is between 0.7 micrometers and 1.0 micrometers. In embodiments, at least one of width 218 and pixel-pitch 214 is between 0.7 micrometers and 3.0 micrometers. A first quantum efficiency of photodiode region 212 may be lower than a second quantum efficiency of photodiode region 213. Accordingly, photodiode region 212 may be referred to as bright-light photodiode sensing region for resolving pixel data in bright-light portions of an image. Photodiode regions 213 may be referred to as low-light photodiode sensing regions for resolving pixel data in low-light portions of the image.

A back surface 220 of semiconductor substrate 210 forms a plurality of trenches 221 surrounding each of photodiode regions 212, 213 in a cross-sectional plane parallel to a back-surface region 228 of back surface 220 above photodiode region 212. A trench 221 isolates photodiode region 212 from adjacent photodiode regions 213. Back-surface region 228 may be parallel to the x-y plane. Buffer layer 250 is on back surface 220 and has a uniform thickness 252.

Constituent elements of semiconductor substrate 210 may include at least one of silicon and germanium. Semiconductor substrate 210 includes a front surface 211 opposite back surface 220. Back surface 220 includes an inner-sidewall surface-region 222, an outer-sidewall surface-region 226, and a bottom surface-region 224 that form each trench 221 of the plurality of trenches 221.

Semiconductor substrate 210 has a thickness 216 between front surface 211 and back-surface region 228. Thickness 216 may range from 2 micrometers to 7 micrometers depending on imaging application (e.g., automobile, mobile phone, biomedical, security, etc.). Trench 221 has a width 223 and a depth 225 in the horizontal and vertical directions respectively. Width 223 may be between 0.10 micrometers and 0.25 micrometers. Depth 225 is with respect to back-surface region 228 and may be between 0.5 micrometers and 2.0 micrometers depending on the thickness 216 of semiconductor substrate 210. In embodiments, thickness 216 exceeds depth 225 by between 0.5 micrometers and 2.0 micrometers for processing consideration such as preventing over-etch damage. In some embodiments, thickness 216 and depth 225 are the same. In embodiments, back surface 220 may be referred to as an illuminated surface, and front surface 211 may be referred to as a non-illuminated surface.

In embodiments, passivation layer 230 is a continuous layer that lines trench 221 and covers back-surface region 228. Passivation layer 230 is located between the plurality of metal annuluses 270 and semiconductor substrate 210. In a horizontal plane, the plurality of metal annuluses 270 defines a plurality of apertures aligning with respective photodiode regions 212, 213. The shape of each metal annulus 270 may be polygonal (such as square, rectangular, or hexagonal), elliptical, circular, or a combination thereof. In at least one embodiment, the shape of each metal annulus 270 is aligned with the shape of each respective photodiode region 212, 213. In embodiments, passivation layer 230 adjoins back surface 220. In embodiments, an additional material layer is between passivation layer 230 and back surface 220. The additional layer may be thinner than passivation layer 230 and may be formed of an oxide-based material. In embodiments, passivation layer 230 conformally covers surface-regions 222, 224, and 226 of each trench 221. Passivation layer 230 may be formed of a high-κ material, e.g., a material having a dielectric constant κ greater than or equal that of silicon nitride (κ≥7). Passivation layer 230 may have fixed negative charges creating or inducing a hole accumulation layer proximate to its surface interface with semiconductor substrate 210 surrounding trench 221. Aluminum oxide ($Al_2O_3$) and hafnium oxide ($HfO_2$) are examples of such a high-κ material. Passivation layer 230 may include a single material layer or multi material layer stack.

In embodiments, each trench 221 is filled with a trench-fill material 241. The plurality of trenches 221 may be interconnected forming a grid structure across the array of photodiode regions 212, 213. Trench 221, parts of passivation layer 230 therein, and trench-fill material 241 form a deep-trench isolation (DTI) structure 240 that electrically and/or optically isolate adjacent photodiode regions 212, 213. Trench-fill material 241 may be a dielectric material (such as oxide or low n material), a metal, or a combination thereof. In one embodiment, each of the metal annuluses 270 is aligned with each of trenches 221 in at least one of a vertical direction along with direction A3 and a horizontal direction along with direction A2.

In embodiments, semiconductor substrate 210 includes a two-dimensional array of photodiode regions 212, where respective directions of rows and columns of the two-dimensional array define respective directions of axes A2 and A1. Adjacent photodiode regions 212 are separated by a pixel-pitch 214 in each of the x and y directions. In embodiments, each photodiode region 212 is part of a respective pixel of a pixel array formed in semiconductor substrate 210.

In embodiments, semiconductor substrate 210 also includes a two-dimensional array of photodiode regions 213. Adjacent photodiode regions 213 are separated by pixel-pitch 214. Each photodiode region 213 is between a respective pair of adjacent photodiode regions 212. Multiple photodiode regions 213, such as four photodiode regions 213 may surround a photodiode region 212. Photodiode regions 213 may be part of a pixel array that is interleaved with a pixel array that includes the two-dimensional photodiode array of photodiode regions 212. In embodiments, each photodiode region 212 is surrounded by photodiode region 213.

Color filter array 280 includes a plurality of color filters 282 and 283 for spectrally filtering light transmitted through a microlens 292 or 293 aligned thereto. The plurality of color filters 282 and 283 are disposed in the plurality of apertures defined by respective metal annuluses 270. Adjacent color filters 282, 283 are separated by metal annulus 270. Each color filter 282 is aligned to a respective photodiode region 212. Each color filter 283 is aligned to a respective photodiode region 213. Herein, a color filter or a microlens is aligned to a photodiode region when part of the color filter or microlens is directly above a center of the photodiode region. In embodiments, each of the plurality of color filters 282 and 283 may be one of a red, blue, green, cyan, magenta, yellow, infrared, clear, or panchromatic color filter. In some embodiments, the array of color filters 282 and 283 may be arranged accord to Bayer's pattern. In some embodiments, color filters 282 and adjacent color filter 283 may be of same color.

Buffer layer 250 may be formed of an oxide material. In embodiments, buffer layer 250 is thinned to thickness 252 via chemical mechanical polishing (CMP) process. CMP induces mechanical stress on passivation layer 230, the high-κ layer therebeneath, and back surface 220. The magnitude of the induced mechanical stress increases as the CMP thins buffer layer 250, which can result in dark-current and white-pixel image artifacts in images captures by camera 190. In embodiments, thickness 252 exceeds 0.1 micrometers to provide sufficient thickness for stress relief and to prevent such artifacts.

A cost of requiring thickness 252 to exceed 0.1 micrometers is increased vulnerability to increased optical cross-talk from a photodiode region 213 (also referred as a large photodiode region) to an adjacent photodiode region 212 (also referred as a small photodiode region). For example, FIG. 2 illustrates an optical ray 202 that is refracted by a microlens 293 such that it is incident on buffer layer 250 between metal annuluses 270 and back surface 220 at an incident angle 203. If properly transmitted, optical ray 202 would reach and detected by photodiode region 213 beneath microlens 293. However, after refraction by microlens 293, optical ray 202 propagates through color filter 283, penetrates buffer layer 250 and reaches photodiode region 212 at a location 212L thereof, which results in optical cross-talk.

Figures 3, 4:
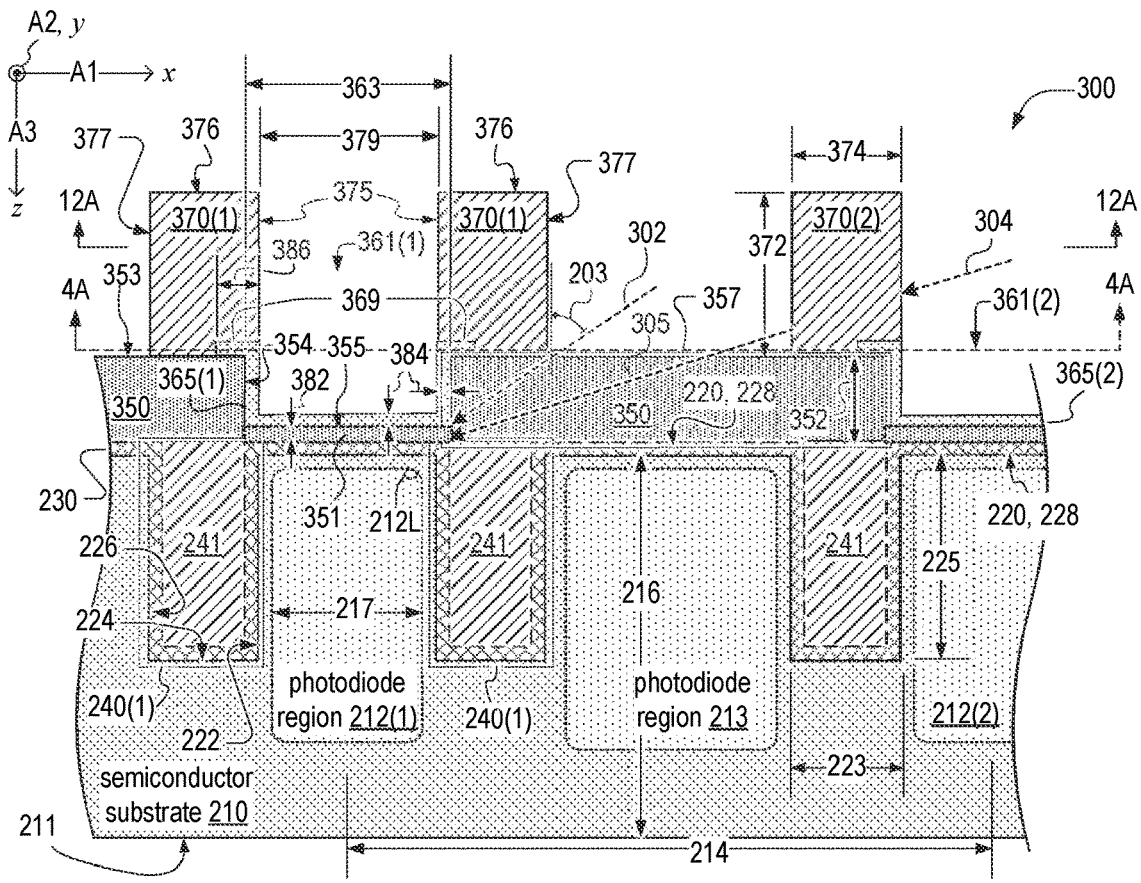
FIG. 3 cross-sectional schematic of a second pixel-array substrate, which is an embodiment of a pixel-array substrate of the camera of FIG. 1.
FIG. 4 is a cross-sectional schematic of a pixel-array substrate, which is an embodiment of the pixel-array substrate of FIG. 3.

FIG. 3 is a cross-sectional schematic of a suppressed cross-talk pixel-array substrate 300, hereinafter pixel-array substrate 300. Pixel-array substrate 300 remedies the optical cross-talk caused by optical ray 202 and the like. Pixel-array substrate 300 is an example of pixel-array substrate 100, and can be used in an image sensor.

Pixel-array substrate 300 includes semiconductor substrate 210, a buffer layer 350, which is an example of buffer layer 250, and a plurality of metal annuluses 370, which is an example of the plurality of metal annuluses 270. In embodiments, each of metal annuluses 370 is formed of a metal such as tungsten or aluminum. In embodiments, the plurality of metal annuluses 370 defines a plurality of apertures aligning with respective photodiode regions 212, 213. For example, metal annulus 370(1) defines a first aperture within an inner width 379 of metal annulus 370(1) aligning with photodiode region 212(1). In another example, metal annulus 370(1) and metal annulus 370(2) at least in part define a second aperture aligning with photodiode region 213. Pixel-array substrate 300 also includes an attenuation layer 365 above a respective photodiode region 212 and reduces intensity of incident light or incident image light directed toward photodiode region 212. For example, the attenuation layer 365 blocks a portion of incident light directed toward the photodiode region 212.

Buffer layer 350 includes a plurality of thick buffer regions 357 and has a top surface 353. In embodiments, buffer layer 350 is formed by depositing a dielectric material, such as an oxide material, on one of either: back surface 220 of semiconductor substrate 210 or a layer disposed on back surface 220, such as passivation layer 230. Buffer layer 350 also includes a feature 361 and, in certain embodiments, a thin buffer region 351 above each of photodiode regions 212. Hereinafter, references to thin buffer region 351 are to instances of buffer layer 350 that include thin buffer region 351 and are not meant to imply that all instances of buffer layer 350 include thin buffer region 351. When buffer layer 350 includes thin buffer region 351, feature 361 is a recess. Otherwise, feature 361 is an aperture. Accordingly, the feature is one of a recess and an aperture depending on the presence of thin buffer region 351 in buffer layer 350 above each photodiode region 212.

FIG. 3 denotes a feature 361(1) and part of an adjacent feature 361(2). Photodiode region 212 beneath feature 361(1) is denoted as photodiode region 212(1). Attenuation layer 365 within feature 361(1) is denoted as attenuation layer 365(1). In embodiments, thin buffer region 351 when present is between photodiode region 212 and the aperture formed by a corresponding metal annulus 370(1) above photodiode region 212. In embodiments, thick buffer region 357 is between photodiode region 213 and the aperture formed of metal annulus 370(1) and adjacent metal annulus 370(2) above photodiode region 213. Thin buffer region 351 has a thickness 382, a width 363, and a top surface 355. In embodiments, in a horizontal plane, each thin buffer region 351 is between adjacent thick buffer regions 357 of buffer layer 350. In embodiments, a thickness 352 of buffer layer 350 exceeds thickness 382 of thin buffer region 351. In embodiments, thickness 352 is between 100 nanometers and 130 nanometers. In some embodiments, thickness 382 may be greater than zero but not exceeding twenty nanometers. In embodiments, width 363 of thin buffer region 351 is equal to or exceeds width 217 of photodiode region 212.

Attenuation layer 365 has a thickness 384, which may be in a vertical and/or a horizontal direction with respect to back surface of semiconductor substrate 210. In embodiments, thickness 384 is between twenty nanometers and forty nanometers. Attenuation layer 365 may be formed of one of titanium, titanium nitride, and a combination thereof. Attenuation layer 365 may be a single layer or multi-layer stack. For example, attenuation layer 365 may comprise a stack of titanium and titanium nitride. Attenuation layer 365 may have an outer section 369, which also extends to an area between top surface 353 of buffer layer 350 and metal annulus 370 such as metal annulus 370(1). In embodiments, a length 386 of outer section 369 along direction A1 is between fifty nanometers and one hundred nanometers. Attenuation layer 365 may be conformal to at least one of surfaces 353, 354, and 355 above each photodiode region 212. In other words, attenuation layer 365 is in between incident light directed toward photodiode region 212 and photodiode region 212. In embodiments, attenuation layer 365 is coated on the thin buffer region on feature 361. In embodiments, color filter for photodiode region 212 is disposed on the attenuation layer 365. That is, incident light directed to photodiode region by respective microlens such as microlens 292 passes through respective color filter and attenuation layer 365 before reaching photodiode region 212. In embodiments, attenuation layer 365 reduces the light sensitivity of photodiode region 212, thereby lowering the quantum efficiency of photodiode region 212 preventing photodiode region 212 from saturation during an integration or exposure period of the image sensor.

Attenuation layer 365 may block, attenuate, or reduce intensity of optical rays propagating between metal annulus 370(1) and DTI structure 240(1), by absorption or reflection, thereby reducing optical cross-talk. Restated, the attenuation layer 365 in FIG. 3 coating on feature 361 ensures all incident light propagating toward photodiode region 212 are attenuated or with light intensity reduced before reaching photodiode region 212. For example, FIG. 3 illustrates an optical ray 302 that is incident on buffer layer 350 at an incident angle 203, which is the same incident angle as optical ray 202. In embodiments, optical ray 302 propagates at incident angle 203 after having been refracted by a microlens (not shown) aligned above large photodiode region 213. Optical ray 202 results in optical crosstalk in pixel-array substrate 200, FIG. 2. Optical ray 302 has a trajectory that, like optical ray 202, intersects location 212L of photodiode region 212. Yet, attenuation layer 365 blocks optical ray 302 by absorption or reflection, and hence prevents optical ray 302 from reaching location 212L of small photodiode region 212. In one example, optical ray 302 is blocked or greatly attenuated in its intensity after passing through the attenuation layer 365 before reaching location 212L of small photodiode region 212 such that optical ray 302 would not impact the sensitivity of photodiode region 212. Attenuation layer 365 in this example prevents optical cross-talk caused by optical ray 302.

In another example, FIG. 3 illustrates optical rays 304 and 305. Optical ray 305 propagates between metal annulus 370(1) and DTI structure 240(1) such that it reaches photodiode region 212. Absent metal annulus 370(2), optical ray 305 is a continuation of optical ray 304. However, for optical ray 305 to traverse such a path, the incident angle of optical ray 305 must be so large that metal annulus 370(2) is between photodiode region 212 and optical ray 304, such that optical ray 304 is blocked before it can propagate (as optical ray 305) to photodiode region 212.

Each metal annulus 370 has an inner sidewall 375, a top surface 376, an outer sidewall 377, a height 372, and a width 374 along A1 direction. In embodiments, height 372 is between 0.1 micrometers and 0.3 micrometers, which balances a tradeoff between crosstalk reduction and angular response of pixels that include a respective photodiode region 212 or 213. In embodiments, width 374 is between 0.16 micrometers and 0.26 micrometers.

FIG. 4 is a cross-sectional schematic of a pixel-array substrate 400, which is an example of pixel-array substrate 300. The cross-section of FIG. 4 is in cross-sectional plane 4A shown in FIG. 3. FIG. 4 denotes a cross-sectional plane 3A, which is an example of the cross-sectional plane of FIG. 3. Pixel-array substrate 400 includes a plurality of photodiode regions 412 and a plurality of photodiode regions 413, which are respective examples of photodiode regions 212 and a plurality of photodiode regions 213. While cross-sectional plane 4A does not intersect photodiode regions 412 and 413, FIG. 4 illustrates photodiode regions 412 and 413 to show their positions with respect to metal annuluses 370 and attenuation layer 365.

In embodiments, each photodiode region 412 is located within a quadrilateral region defined by respective photodiode regions 413 that form a two-by-two array of photodiode regions 413. In embodiments, the shape of the quadrilateral region is one of a square, an octagonal, a triangle, a rectangle, and a parallelogram. For example, photodiode region 412(1) is located within a rectangular area 419(1) defined by respective centers of photodiode regions 413(1-4), and 412(3) is located within a rectangular area 419(2) defined by respective centers of photodiode regions 413(3-6). In embodiments, photodiode regions 412(1) and 412(3) are located at respective centers of rectangular area 419(1) and 419(2). In embodiments, photodiode region 412(1) is surrounded by photodiode regions 413(1-4). In embodiments, photodiode region 413(4) is surrounded by photodiode regions 412(1-4).

In an embodiment, a device transistor region (not illustrated for simplicity) is defined on front surface 211 in a region between adjacent photodiode regions 212 or a region between adjacent photodiode regions 213. The device transistor region which includes at least a pixel transistor (e.g., source follower, reset transistor, row select) is formed on front surface 211 and couples to corresponding photodiode regions 212, 213 controlling the operation of respective pixel containing photodiode regions 212 or 213.

In embodiments, each photodiode region 412 is part of a respective pixel of a pixel array 416A formed in a semiconductor substrate such as semiconductor substrate 210, and each photodiode region 413 is part of a respective pixel of a pixel array 417A formed in semiconductor substrate 210. Pixel-array substrate 400 is an example of pixel-array substrate 100, such that, in embodiments, pixel array 112A includes both pixel array 416A and pixel array 417A.

Figure 5:
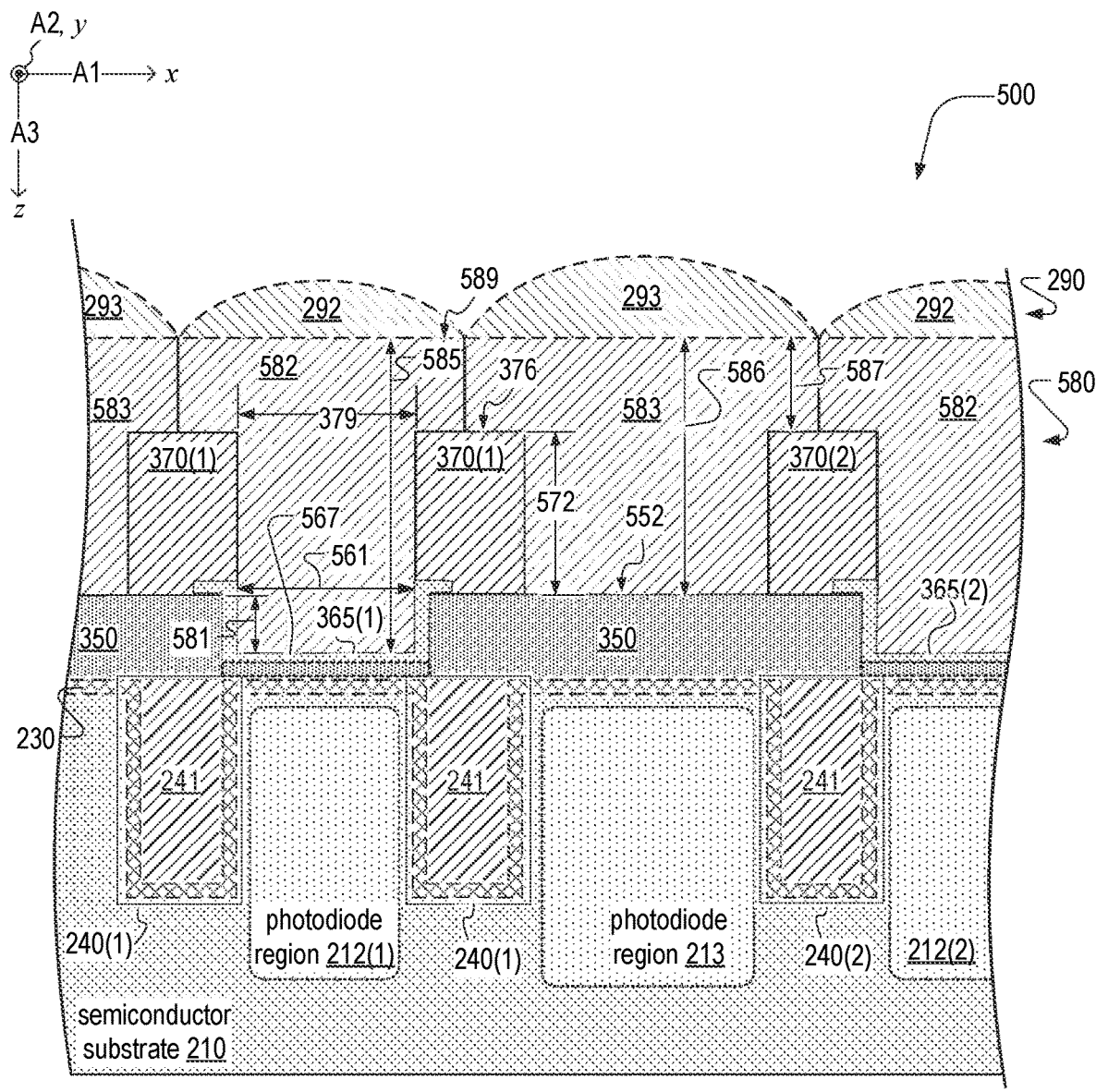
FIG. 5 cross-sectional schematic of a pixel-array substrate, which is an embodiment of the pixel-array substrate of FIG. 3.

FIG. 5 is a cross-sectional schematic of a pixel-array substrate 500, which is pixel-array substrate 300 with the addition of microlens array 290 and color filter array 580 on buffer layer 350. Color filter array 580 is similar to color filter array 280, and includes color filters 582 and 583, which are analogous to color filters 282 and 283, respectively. Each color filter 582 is aligned to a respective attenuation layer 365 and photodiode region 212. Each color filter 583 is aligned to a respective photodiode region 213. In embodiments, color filter 582 is formed of a first color filter material for transmitting an incident light within a first wavelength range, and color filter 583 is formed of a second color filter material for transmitting an incident light within a second wavelength range. In some embodiments, the first wavelength range and the second wavelength range are the same. In one example, both color filter 582 and color filter 583 are formed of the same color filter material, and first wavelength range is the same as second wavelength range, for example both color filter 582 and color filter 583 are red color filters. In some embodiments, the first wavelength range and the second wavelength range are different. In one example, color filter 582 and color filter 583 may be different color filters such that color filter 582 may be a green color filter while color filter 583 may be a red or blue color filter.

In embodiments, a width 561 of center section 567 may be less than or equal to inner width 379 of metal annulus 370. Width 561 of center section 567 may be equal to or greater than a width of photodiode region 212, such as width 217 of photodiode region 212 in FIG. 2. Top surface 376 of metal annulus 370 is at a height 572 with respect to a top surface 552 of buffer layer 350. Top surface 589 of color filter array 580 is at a height 586 with respect to top surface 552 and at a height 585 with respect to the top surface of center section 567 of attenuation layer 365. Restated, each of color filters 582 has height 585 and each of color filters 583 has height 586. Height 585 exceeds height 586 by a distance 581. In other words, a thickness of color filter 582 is greater than a thickness of color filter 583. Alternatively, a distance between color filter 582 and back surface of semiconductor substrate 210 is less than a distance between color filter 583 and back surface of semiconductor substrate 210. An optimal range of height 586 is determined by balancing a trade-off between filtering undesired wavelengths and attenuating desired wavelengths of illumination incident on photodiode regions 212 and 213. Height 586 exceeds height 572 by a distance 587, which, in embodiments, is between five nanometers and forty nanometers, such that the plurality of metal annuluses 370 is embedded in color filter array 580. In some embodiments, although not illustrated, additional dielectric material having a refractive index lower than color filters, such as silicon oxide, may be disposed on the plurality of metal annuluses 370 spanning spacing in between adjacent color filters 582, 583 to induce internal reflection confining incident light within respective color filter, thereby further reducing cross-talk between adjacent photodiode regions 212, 213.

In embodiments, pixel-array substrate 500 also includes microlens array 290, which includes the plurality of microlenses 292 and 293. Each microlens 292 is aligned to a respective photodiode region 212 for directing incident light thereon to photodiode region 212. Each microlens 293 is aligned to a respective photodiode region 213 for directing incident light thereon to photodiode region 213.

Figure 6:
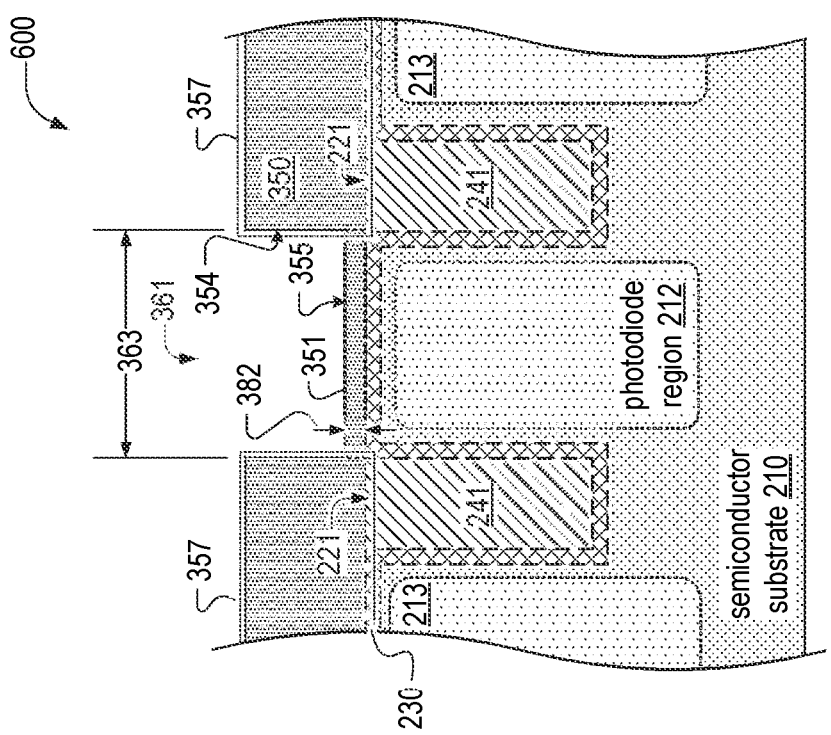

FIGS. 6-10 are respective cross-sectional schematics of intermediate substrates formed in a process of fabricating pixel-array substrate 300. FIG. 6 is a cross-sectional schematic of an intermediate substrate 600, which includes semiconductor substrate 210 having a plurality of trenches 221, passivation layer 230, and a buffer layer 350. Passivation layer 230 is between buffer layer 350 and semiconductor substrate 210. In embodiments, passivation layer 230 and buffer layer 350 may be sequentially deposited on back surface of semiconductor substrate. Each trench 221 of semiconductor substrate 210 is lined with passivation layer 230 and filled with trench-fill material 241. Passivation layer 230 may include an anti-reflection layer formed, for example, of tantalum oxide. In some embodiments, the anti-reflection layer may be formed of one layer or multi-layer stack to achieve a target light transmittance to underlying photodiode regions 212, 213. In some embodiments, the anti-reflection layer may be the topmost layer of the passivation layer. For example, the anti-reflection layer may be a layer coated on outermost surface of the passivation layer 230. Buffer layer 350 includes a feature 361. In certain embodiments, buffer layer 350 also includes thin buffer region 351 adjacent to thick buffer regions 357 and above photodiode region 212, as illustrated in FIG. 6, such that feature 361 is a recess. In other embodiments, when buffer layer 350 does not include thin buffer region 351 (i.e., thickness 382 is of zero-thickness), feature 361 is an aperture. For example, portions of buffer layer 350 above photodiode region 212 may be completely removed, such that buffer layer 350 does not include thin buffer region 351, and feature 361 is an aperture. In embodiments, feature 361 is formed by applying a photoresist patterned with openings above photodiode region 212, followed by an etching process to remove parts of buffer layer 350.

Figure 7:
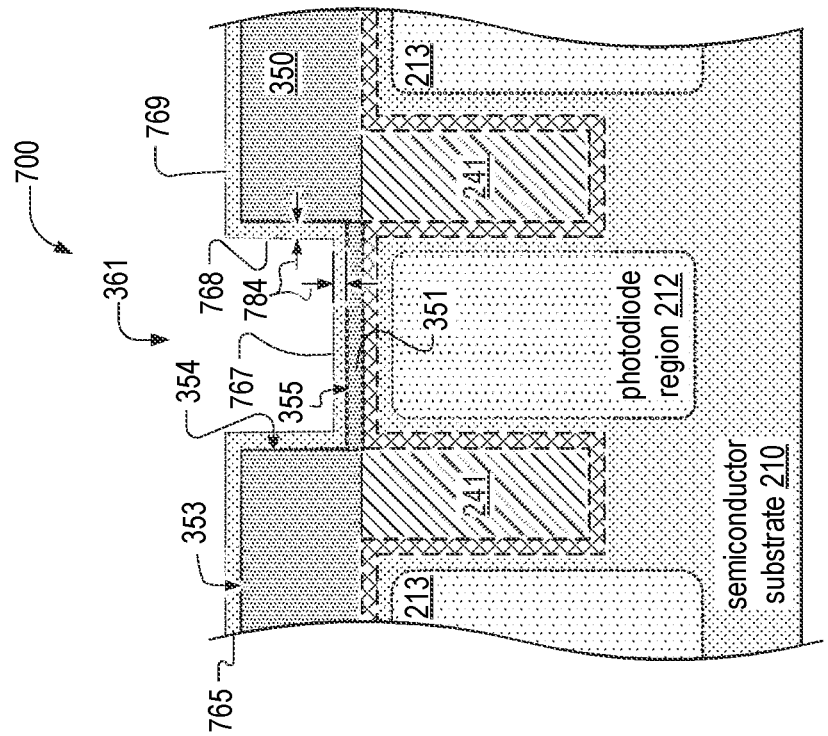
FIGS. 6, 7, 8, 9, 10A, and 10B are respective cross-sectional schematics of intermediate substrates formed in a process of fabricating the pixel-array substrate, in embodiments.

FIG. 7 is a cross-sectional schematic of an intermediate substrate 700, which is intermediate substrate 600 after deposition of an attenuation layer 765 onto buffer layer 350. Attenuation layer 765 may be formed by deposition of at least one of titanium and titanium nitride. Attenuation layer 765 includes a center section 767, a middle section 768, and an outer section 769. In embodiments, center section 767 is disposed on top surface 355 of thin buffer region 351, and middle section 768 is disposed on side surface 354 while outer section 769 is disposed on top surface 353 of buffer layer 350. Alternatively, middle section 768 is extended from center section 767 surrounding center section 767 and coated on the sidewall surfaces of buffer layer 350. Outer section 769 is extended from middle section 768 onto top surface 353 of buffer layer 350. Attenuation layer 765 has a thickness 784, which may be in a vertical and/or a horizontal direction with respect to back surface of intermediate substrate 600. Thickness 784 of attenuation layer 765 may be determined based on a quantum efficiency target of photodiode region 212. In embodiments, the quantum efficiency target of photodiode region 212 is in the range of 0.005 to 0.01 (e.g., 0.5% to 1%) for 530 nm wavelength light. In embodiments, thickness 784 is between twenty nanometers and forty nanometers. Above photodiode region 212, intermediate substrate 700 also includes a feature 361, and attenuation layer 765 may be conformal to the profile of feature 361.

Figure 8:
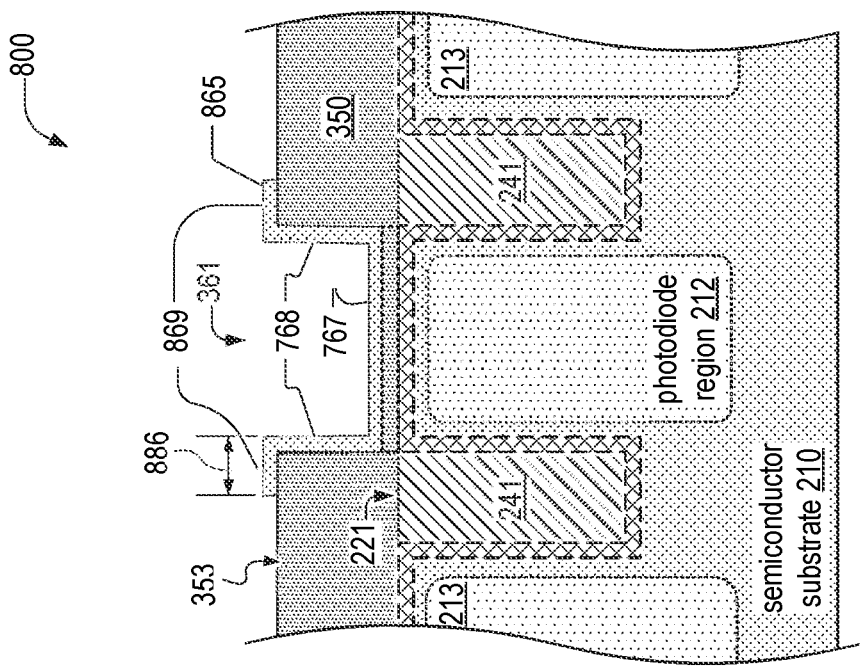

FIG. 8 is a cross-sectional schematic of an intermediate substrate 800, which is intermediate substrate 700 after removal of sections of attenuation layer 765 (such as sections of attenuation layer 765 above photodiode region 213), via etching for example, above parts of buffer layer 350. Intermediate substrate 800 includes an attenuation layer 865, which is an example of attenuation layer 365. Attenuation layer 865 has a center section 767, a middle section 768, and an outer section 869. Outer section 869, which is an example of outer section 369, may extend to an area on top surface 353 of buffer layer 350. Middle section 768 is extended from center section 767 surrounding center section 767 and coated on the sidewall surfaces of buffer layer 350. Buffer layer 350 may also in part surround middle section 768. Outer section 869 is extended from middle section 768 a length 886 onto top surface 353 of buffer layer 350. In embodiment, the outer section 869 overlaps part of trench 221 to ensure that the light sensing or exposure area of photodiode region 212 is fully covered by attenuation layer 365 such that incoming light for photodiode region 212 passes through attenuation layer 365. In embodiments, length 886 of outer section 869 may be between fifty nanometers and one hundred nanometers. The lower limit of length 886 may be determined by variations in the etching process. However, outer section 869 does not affect the light exposure to adjacent photodiode regions 213, such that, in embodiments, outer section 869 does not cover any part of the light sensing or light exposure area of adjacent photodiode regions 213.

Figure 9:
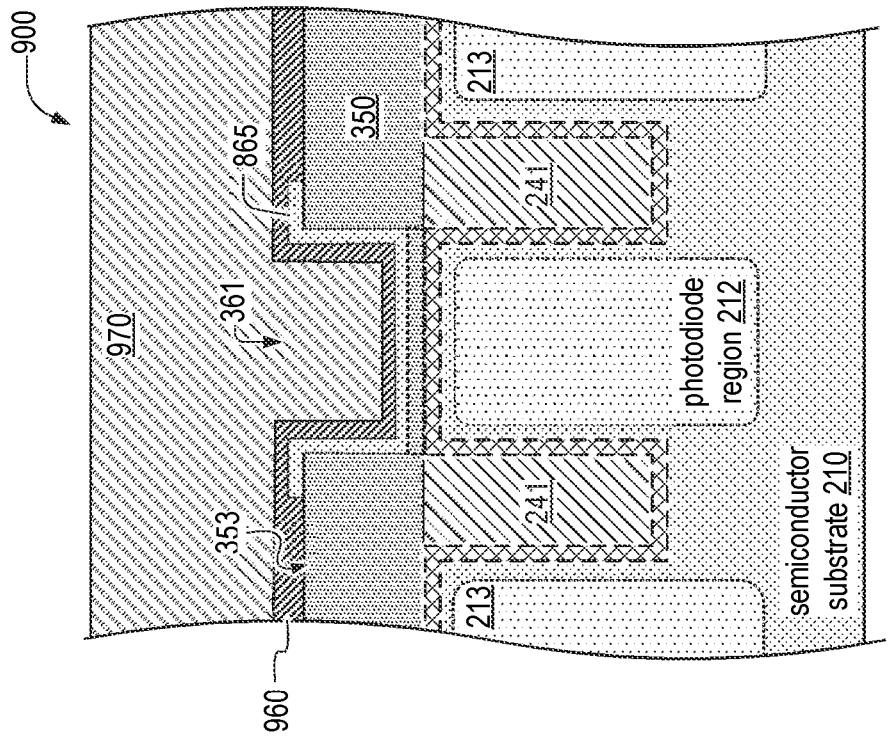

FIG. 9 is a cross-sectional schematic of an intermediate substrate 900. Intermediate substrate 900 is intermediate substrate 800 after deposition of a metal layer 970. For examples, metal layer 970 is deposited on top surface 353 of buffer layer 350 and on attenuation layer 865 above photodiode region 212. In embodiments, metal layer 970 is formed of metal, such as tungsten or aluminum. In embodiments, an adhesion layer 960, formed of titanium nitride for example, is deposited on intermediate substrate 800 prior to the deposition of metal layer 970. In these embodiments, the thickness of the adhesion layer 960 is between twenty nanometers and forty nanometers.

Figure 10B:
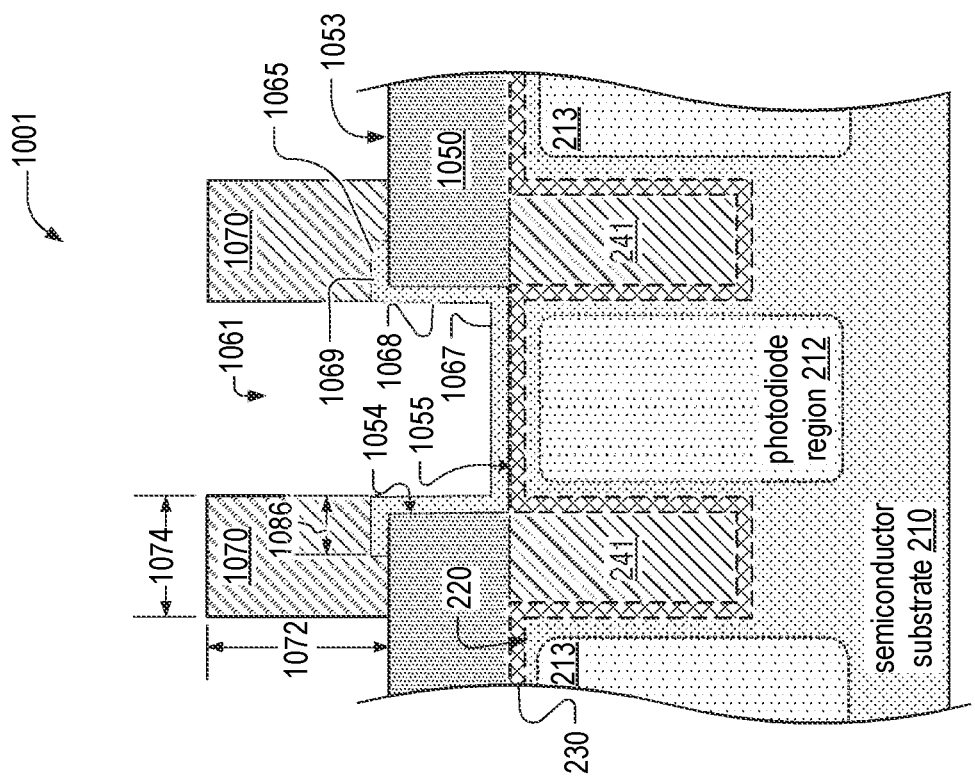
Figure 10A:
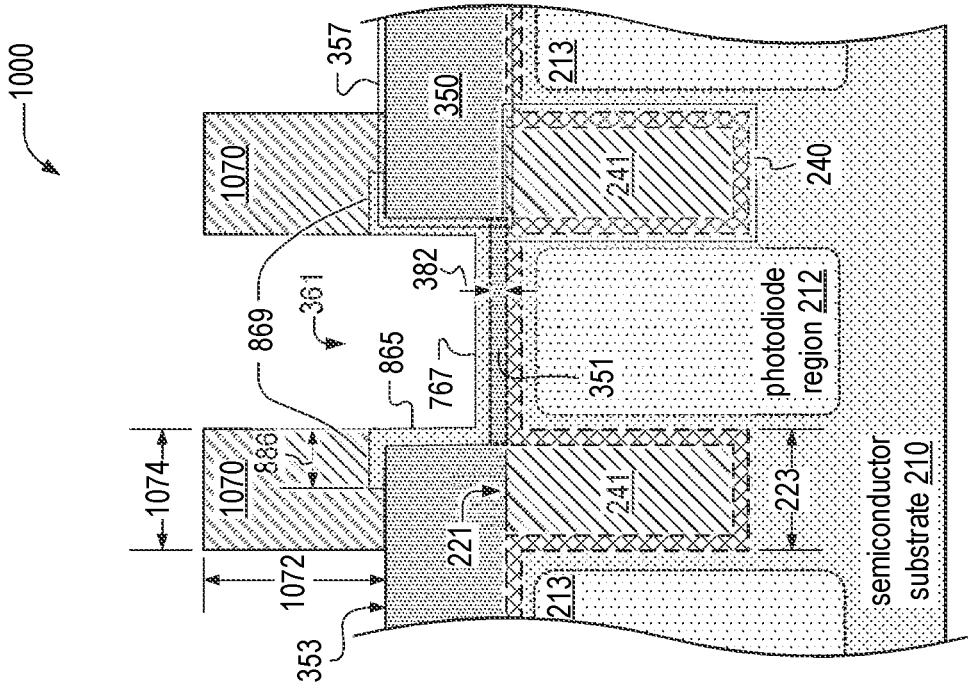

FIG. 10A is a cross-sectional schematic of an intermediate substrate 1000. Intermediate substrate 1000 is intermediate substrate 900 after removal of sections of metal layer 970 above photodiode regions 212 and 213. Intermediate substrate 1000 includes a metal annulus 1070, which is a remaining section of metal layer 970 after a layer-removing process, such as lithography followed by etching. Metal annulus 1070, an example of metal annulus 370, has a height 1072 with respect to top surface 353 of buffer layer 350, and has a width 1074. In embodiments, the height 1072 is between 0.1 and 0.3 micrometers. In embodiments, width 1074 may be equal to or greater than width 223 of trench 221. Intermediate substrate 1000 also includes an attenuation layer 865, which is an example of attenuation layer 365. In embodiments, at least a center section 767 of attenuation layer 865 is formed on the thin buffer region 351 of the buffer layer 350. In embodiments, outer section 869 of attenuation layer 865 extends for a length 886 in an area between buffer layer 350 and metal annulus 1070. In embodiments, length 886 is between 50 and 100 nanometers.

Intermediate substrate 1000 also includes feature 361 and may include thin buffer region 351 with thickness 382. When feature 361 is a recess, thickness 382 may be sufficiently thin to suppress cross-talk from optical rays, such as optical ray 302 of FIG. 3, propagating from an area between metal annulus 1070 and DTI structure 240 toward photodiode region 212.

FIG. 10B is a cross-sectional schematic of an intermediate substrate 1001. Intermediate substrate 1001 is an alternate embodiment of intermediate substrate 1000. Intermediate substrate 1001 includes a buffer layer 1050 and an attenuation layer 1065, which are respective examples of buffer layer 350 and attenuation layers 365 and 865. Buffer layer 1050 includes a top surface 1053, which is an example of top surface 353. Intermediate substrate 1001 also includes a feature 1061, which is an example of feature 361. Feature 1061 in this embodiment is an aperture, as buffer layer 1050 does not include a thin buffer region. Feature 1061 may be formed by completely removing, via etching for example, a respective section of buffer layer 1050 above each photodiode region 212. Removing the section yields a side surface 1054, which is an example of side surface 354, and exposes a top surface 1055 of either back surface 220 of semiconductor substrate 210 or a layer disposed on back surface 220 of semiconductor substrate 210, such as passivation layer 230. Attenuation layer 1065 includes a center section 1067 above photodiode region 212, a middle section 1068, and an outer section 1069, which are respective examples of center section 767, middle section 768, and outer section 869 of intermediate substrate 800. In one embodiment, center section 1067 of attenuation layer 1065 is formed directly on top surface 1055 that may be top surface of passivation layer 230 or back surface 220 of semiconductor substrate 210 while middle section 1068 and outer section 1069 are formed directly and conformally on side surface 1054 and top surface 1053 of buffer layer 1050, respectively. In one embodiment, where passivation layer 230 includes an anti-reflection layer as topmost layer, the attenuation layer 1065 may be directly formed on the anti-reflection layer. In embodiments, outer section 1069 extends for a length 1086 in an area between buffer layer 1050 and metal annulus 1070. In embodiments, length 1086 is between 50 and 100 nanometers.

In embodiments of intermediate substrate 1001, the process of creating an aperture, which may include etching process to remove parts of the buffer layer, may result in increased dark current from surface damage. For example, when a part of buffer layer 1050 above each photodiode region 212 is removed by etching to create feature 1061, passivation layer 230 and/or semiconductor substrate 210 may suffer surface damage that could induce dark current noise. To prevent such a case, intermediate substrate 1000 may be preferred over intermediate substrate 1001.

FIG. 11 is a flowchart illustrating a method 1100 for fabricating a pixel-array substrate. Method 1100 includes steps 1110, 1120 and 1130. Method 1100 may be implemented by part or all of any of pixel-array substrates 100, 200, 300, and 500. Method 1100 may also include one or both of steps 1140 and 1150.

Step 1110 includes forming a feature in a buffer layer located on a surface of a semiconductor substrate above a first photodiode region, the semiconductor substrate including a trench surrounding the first photodiode region, the feature being one of a recess and an aperture. In one embodiment, the semiconductor substrate may have a surface that forms at least a trench surrounding the first photodiode region, for example by patterning and etching process. In one example, the buffer layer is formed by depositing a dielectric material, which may be an oxide-based material or low n material, i.e., a dielectric material with refractive index lower than semiconductor substrate. The trench may be filled with dielectric material that forms a trench isolation structure electrically and/or optically isolating photodiode regions. In embodiments, photodiode region 212 is adjacent to photodiode region 213. In an example of step 1110, in intermediate substrate 600, FIG. 6, feature 361 in a form of a recess is formed by a layer removing process, such as etching, above photodiode region 212 in buffer layer 350 that thins buffer layer 350 forming a thin buffer region above photodiode region 212. In another example of step 1110, in intermediate substrate 1001, feature 1061 in a form of an aperture is formed by removing a part of buffer layer 1050 completely above photodiode region 212 by using a layer removing process, such as etching.

Step 1120 includes forming an attenuation layer between an incident light directed toward the first photodiode region and the first photodiode region. In some embodiments, the attenuation layer blocks a portion of incident light (e.g., incident image light) directed toward the first photodiode region from reaching the first photodiode region. In embodiments, the attenuation layer may be formed of light absorption material. The attenuation layer may be formed of one of titanium, titanium nitride, and a combination thereof. In an example of step 1120, in intermediate substrate 800, FIG. 8, attenuation layer 865 is formed after removing parts of attenuation layer 765, such that attenuation layer 865 has a center section 767 above photodiode region 212, a middle section 768, and, above buffer layer 350, an outer section 869. In intermediate substrate 1000, FIG. 10A, outer section 869 is disposed in an area between top surface 353 of buffer layer 350 and metal annulus 1070. In another example of step 1120, in intermediate substrate 1001, FIG. 10B, attenuation layer 1065 is formed above photodiode region 212 after removing parts of buffer layer 1050 to form feature 1061. Attenuation layer 1065 has a center section 1067, a middle section 1068, and an outer section 1069.

Step 1130 includes forming a metal annulus above the trench surrounding the first photodiode region. In an example of step 1130, in intermediate substrate 1000, metal annulus 1070 is formed above DTI structure 240 surrounding photodiode region 212. Forming metal annulus 1070 includes depositing metal layer 970 on top surface 353 of buffer layer 350 and on attenuation layer 865 of intermediate substrate 900, FIG. 9. Forming metal annulus 1070 further includes removing parts of metal layer 970 located above photodiode regions of the intermediate substrate. For example, parts of metal layer 970 above photodiode regions 212 and 213 are removed via etching for example, to yield metal annulus 1070 of intermediate substrates 1000 and 1001 defining apertures aligning with photodiode regions 212 and 213.

Method 1100 may also include one or both of steps 1140 and 1150 for further backside processing, such as formation of array of color filters and array of microlenses and may be performed after the formation of metal annulus in Step 1130. Step 1140 includes depositing a first color filter material on the attenuation layer on the feature above the first photodiode region. Step 1150 includes depositing a second color filter material on the buffer layer above a second photodiode region adjacent to the first photodiode region. For example, color filter materials may be deposited on the metal annulus 1070 and into corresponding apertures defined by metal annulus 1070 to form an array of color filters above photodiode regions 212, 213 such as color filter array 580 of FIG. 5. Thereafter, material for microlens such as polymer may be deposited forming an array of microlenses, such as microlens array 290 of FIG. 5, on the array of color filters aligning with photodiode regions 212, 213.

Figure 12:
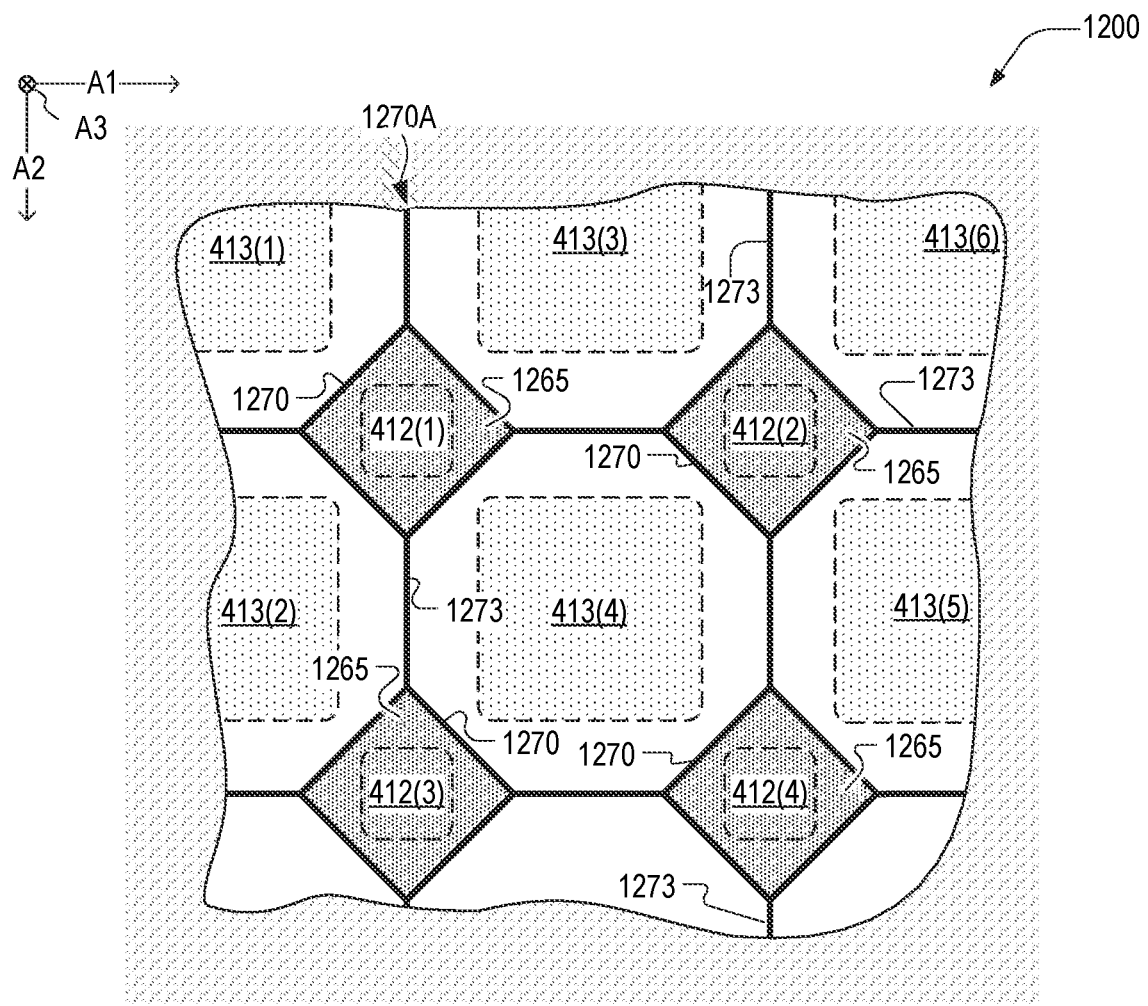
FIG. 12 is a cross-sectional schematic of a pixel-array substrate, which is an embodiment of the pixel-array substrate of FIG. 3.

FIG. 12 is a cross-sectional schematic of a pixel-array substrate 1200, which is an example of pixel-array substrate 300. The cross-section of FIG. 12 is in a cross-sectional plane 12A shown in FIG. 3. Pixel-array substrate 1200 includes a metal grid 1270A formed of a plurality of metal annuluses 1270 and a plurality of interconnecting segments 1273 that connect adjacent metal annuluses 1270. Examples of metal annulus 1270 include metal annulus 370 and metal annulus 1070. In embodiments, metal annuluses 1270 and interconnecting segments 1273 are integrally formed such that metal grid 1270A is monolithic. In embodiments, metal annuluses 1270 and interconnecting segments 1273 form a plurality of apertures aligned with photodiode regions 412 and 413. In embodiments, each interconnecting segment 1273 align with a respective trench or part of the trench that surrounds a photodiode region 413. For clarity of illustration, not all interconnecting segments 1273 are labeled in FIG. 12. While attenuation layers 1265, which are examples of attenuation layers 365 and 865, and photodiode regions 412 and 413 are not in cross-sectional plane 12A, FIG. 12 illustrates them for sake of illustrating the alignment of metal grid 1270A to photodiode regions 412 and 413.

The shape of photodiode regions 412 and 413 although is illustrated as square in FIG. 12, however, in other embodiment photodiode regions 412 and 413 can be shaped conformal to the shape (e.g., diamond-shaped or polygonal shape) defined by the surrounding deep-trench isolation structure and/or surrounding metal annuluses 1270 and interconnecting segments 1273.

COMBINATIONS OF FEATURES

Features described above as well as those claimed below may be combined in various ways without departing from the scope hereof. The following enumerated examples illustrate some possible, non-limiting combinations.

(A1) A reduced cross-talk pixel-array substrate includes a semiconductor substrate, a buffer layer, a metal annulus, and an attenuation layer. The semiconductor substrate includes a first photodiode region. A back surface of the semiconductor substrate forms a trench surrounding the first photodiode region in a cross-sectional plane parallel to a first back-surface region of the back surface above the first photodiode region. The buffer layer is on the back surface and has a feature located above the first photodiode region with the feature being one of a recess and an aperture. The metal annulus is on the buffer layer and covers the trench. The attenuation layer is above the first photodiode region.

(A2) In embodiments of pixel-array substrate (A1), a thickness of a first portion of the buffer layer above the first photodiode region is less than a thickness of a second portion of the buffer layer above a second photodiode region in the semiconductor substrate adjacent to first photodiode region.

(A3) In embodiments of pixel-array substrate (A2), when the feature is a recess, the attenuation layer is conformally disposed on at least one of (i) a top surface of the buffer layer, (ii) a side surface of the buffer layer and (iii) a top surface of the first portion of the buffer layer.

(A4) In embodiments of any of pixel-array substrates (A2)-(A3), when the feature is an aperture, the attenuation layer is disposed conformally on at least one of (i) a top surface of the buffer layer, (ii) a side surface of the buffer layer, (iii) the back surface of the semiconductor substrate, and (iv) a layer disposed on the back surface of the semiconductor substrate.

(A5) In embodiments of any of pixel-array substrates (A1)-(A4), a first full well capacity of the first photodiode region is less than a second full well capacity of a second photodiode region of the semiconductor substrate.

(A6) In embodiments of any of pixel-array substrates (A1)-(A5), the attenuation layer includes (i) a center section above the first photodiode region, (ii) a middle section surrounding the center section on a side surface of the buffer layer, and (iii) an outer section between the buffer layer and the metal annulus.

(A7) In embodiments of pixel-array substrate (A6), a length of the outer section is between 50 nanometers and 100 nanometers.

(A8) In embodiments of any of pixel-array substrates (A6)-(A7), a width of the center section is less than or equal to an inner width of the metal annulus.

(A9) In embodiments of any of pixel-array substrates (A1)-(A8), when the feature is a recess, a thickness of the buffer layer between the recess and the back surface of the semiconductor substrate is greater than zero and not exceeding twenty nanometers.

(A10) Embodiments of any of pixel-array substrates (A1)-(A9) further includes an adhesion layer between the metal annulus and the buffer layer.

(A11) Embodiments of any of pixel-array substrates (A1)-(A10) further includes a first color filter and a second color filter each having a height that exceeds a height of the metal annulus with respect to a top surface of the buffer layer. The first color filter is disposed on the attenuation layer above the first photodiode region, and the second color filter is disposed on the buffer layer above a second photodiode region in the semiconductor substrate adjacent to the first photodiode region.

(A12) In embodiments of pixel-array substrate (A11), the first color filter has a thickness that exceeds a thickness of the second color filter.

(A13) In embodiments of any of pixel-array substrates (A1)-(A12), the semiconductor substrate further includes four second-photodiode regions forming a two-by-two array. And in the cross-sectional plane, the first photodiode region is located within a quadrilateral region defined by respective centers of the four second-photodiode regions.

(A14) In embodiments of any of pixel-array substrates (A1)-(A13), a thickness of the attenuation layer is between twenty nanometers and forty nanometers.

(A15) In embodiments of any of pixel-array substrates (A1)-(A14), the attenuation layer is formed of one of titanium and titanium nitride.

(A16) In embodiments of any of pixel-array substrates (A1)-(A15), a thickness of the buffer layer is between 0.10 micrometers and 0.13 micrometers.

(A17) In embodiments of any of pixel-array substrates (A1)-(A16), the metal annulus is formed of tungsten.

(A18) In embodiments of any of pixel-array substrates (A1)-(A17), the metal annulus has a height between 0.1 and 0.3 micrometers with respect to a top surface of the buffer layer.

(B1) A method for fabricating a reduced cross-talk pixel-array substrate includes (i) forming a feature in a buffer layer located on a surface of a semiconductor substrate above a first photodiode region, the semiconductor substrate including a trench surrounding the first photodiode region, the feature being one of a recess and an aperture, (ii) forming an attenuation layer that includes a center section above the first photodiode region, a middle section surrounding the center section, and an outer section on the buffer layer; and (iii) forming a metal annulus above the trench surrounding the first photodiode region.

(B2) In embodiments of method (B1), in said step of forming, when the feature is a recess, a thickness of the buffer layer between the recess and the first photodiode region is greater than zero and not exceeding twenty nanometers.

(B3) In embodiments of one of methods (B1) and (B2), in said step of forming an attenuation layer, a length of the outer section is between 50 nanometers and 100 nanometers.

(B4) In embodiments of one of methods (B1)-(B3), said step of forming a metal annulus includes forming the metal annulus at least partially on the outer section of the attenuation layer defining an aperture aligning with the first photodiode region.

(B5) Embodiments of one of methods (B1)-(B4) further includes (i) depositing a first color filter material on the attenuation layer on the feature above the first photodiode region, and (ii) depositing a second color filter material on the buffer layer above a second photodiode region adjacent to the first photodiode region.

(B6) In embodiments of one of methods (B1)-(B5), in said step of forming a feature, a thickness of a first portion of the buffer layer forming the feature above the first photodiode region is less than a thickness of a second portion of the buffer layer above a second photodiode region of the semiconductor substrate.

(B7) In embodiments of one of methods (B1)-(B6), said step of forming a metal annulus includes forming the metal annulus such that the outer section of the attenuation layer is between the metal annulus and the buffer layer.

(B8) In embodiments of one of methods (B1)-(B7), in said step of forming a metal annulus, a width of the metal annulus is between 0.16 micrometers and 0.26 micrometers.

Changes may be made in the above methods and systems without departing from the scope of the present embodiments. It should thus be noted that the matter contained in the above description or shown in the accompanying drawings should be interpreted as illustrative and not in a limiting sense. Herein, and unless otherwise indicated the phrase "in embodiments" is equivalent to the phrase "in certain embodiments," and does not refer to all embodiments. The following claims are intended to cover all generic and specific features described herein, as well as all statements of the scope of the present method and system, which, as a matter of language, might be said to fall therebetween.

What is claimed is:

1. A pixel-array substrate comprising:
   a semiconductor substrate including a first photodiode region, a back surface of the semiconductor substrate forming a trench surrounding the first photodiode region in a cross-sectional plane parallel to a first back-surface region of the back surface above the first photodiode region;
   a buffer layer on the back surface and including a feature located above the first photodiode region, the feature being one of a recess and an aperture, wherein a thickness of a first portion of the buffer layer above the first photodiode region is less than a thickness of a second portion of the buffer layer above a second photodiode region in the semiconductor substrate adjacent to first photodiode region;
   a metal annulus on the buffer layer and covering the trench; and
   an attenuation layer above the first photodiode region.

2. The pixel-array substrate of claim 1, the feature being a recess, the attenuation layer being conformally disposed on at least one of (i) a top surface of the buffer layer, (ii) a side surface of the buffer layer and (iii) a top surface of the first portion of the buffer layer.

3. The pixel-array substrate of claim 1, the feature being an aperture, the attenuation layer being disposed conformally on at least one of (i) a top surface of the buffer layer, (ii) a side surface of the buffer layer, (iii) the back surface of the semiconductor substrate, and (iv) a layer disposed on the back surface of the semiconductor substrate.

4. A pixel-array substrate of claim 1, comprising:
   a semiconductor substrate including a first photodiode region, a back surface of the semiconductor substrate forming a trench surrounding the first photodiode region in a cross-sectional plane parallel to a first back-surface region of the back surface above the first photodiode region;
   a buffer layer on the back surface and including a feature located above the first photodiode region, the feature being one of a recess and an aperture;

a metal annulus on the buffer layer and covering the trench; and an attenuation layer above the first photodiode region;

wherein a first full well capacity of the first photodiode region is less than a second full well capacity of a second photodiode region of the semiconductor substrate.

5. The pixel-array substrate of claim 1, the attenuation layer including:

a center section above the first photodiode region;

a middle section surrounding the center section on a side surface of the buffer layer; and an outer section between the buffer layer and the metal annulus.

6. The pixel-array substrate of claim 5, a length of the outer section being between 50 nanometers and 100 nanometers.

7. The pixel-array substrate of claim 5, a width of the center section being less than or equal to an inner width of the metal annulus.

8. The pixel-array substrate of claim 1, the feature being a recess, a thickness of the buffer layer between the recess and the back surface of the semiconductor substrate being greater than zero and not exceeding twenty nanometers.

9. The pixel-array substrate of claim 1, further comprising an adhesion layer between the metal annulus and the buffer layer.

10. The pixel-array substrate of claim 1, further comprising:

a first color filter and a second color filter each having a height that exceeds a height of the metal annulus with respect to a top surface of the buffer layer, wherein (i) the first color filter is disposed on the attenuation layer above the first photodiode region, and (ii) the second color filter is disposed on the buffer layer above a second photodiode region in the semiconductor substrate adjacent to the first photodiode region.

11. The pixel-array substrate of claim 10, the first color filter having a thickness that exceeds a thickness of the second color filter.

12. The pixel-array substrate of claim 1, the semiconductor substrate further including four second photodiode regions forming a two-by-two array; and in the cross-sectional plane, the first photodiode region being located within a quadrilateral region defined by respective centers of the four second photodiode regions.

13. A method for fabricating a reduced cross-talk pixel-array substrate comprising:

forming a feature in a buffer layer located on a surface of a semiconductor substrate above a first photodiode region, the semiconductor substrate including a trench surrounding the first photodiode region, the feature being one of a recess and an aperture;

forming an attenuation layer that includes a center section above the first photodiode region, a middle section surrounding the center section, and an outer section on the buffer layer; and forming a metal annulus above the trench surrounding the first photodiode region such that the outer section of the attenuation layer is between the metal annulus and the buffer layer.

14. The method of claim 13, in said step of forming a feature, the feature being a recess, a thickness of the buffer layer between the recess and the first photodiode region being greater than zero and not exceeding twenty nanometers.

15. The method of claim 13, in said step of forming an attenuation layer, a length of the outer section being between 50 nanometers and 100 nanometers.

16. The method of claim 13, said step of forming a metal annulus comprising forming the metal annulus at least partially on the outer section of the attenuation layer defining an aperture aligning with the first photodiode region.

17. The method of claim 13, further comprising:

depositing a first color filter material on the attenuation layer on the feature above the first photodiode region; and depositing a second color filter material on the buffer layer above a second photodiode region adjacent to the first photodiode region.

18. The method of claim 13, in said step of forming a feature, a thickness of a first portion of the buffer layer forming the feature above the first photodiode region being less than a thickness of a second portion of the buffer layer above a second photodiode region of the semiconductor substrate.

19. The pixel-array substrate of claim 4, the attenuation layer including:

a center section above the first photodiode region;

a middle section surrounding the center section on a side surface of the buffer layer; and an outer section between the buffer layer and the metal annulus.

20. The pixel-array substrate of claim 4, wherein a thickness of a first portion of the buffer layer above the first photodiode region is less than a thickness of a second portion of the buffer layer above a second photodiode region in the semiconductor substrate adjacent to first photodiode region.

* * * * *

UNITED STATES PATENT AND TRADEMARK OFFICE
CERTIFICATE OF CORRECTION

| | | |
|---|---|---|
| PATENT NO. | : 12,087,792 B2 | Page 1 of 1 |
| APPLICATION NO. | : 17/572413 | |
| DATED | : September 10, 2024 | |
| INVENTOR(S) | : Seong Yeol Mun et al. | |

It is certified that error appears in the above-identified patent and that said Letters Patent is hereby corrected as shown below:

In the Claims

Column 16, Line 58, Claim 4, "A pixel-array substrate of claim 1, comprising" should read --A pixel-array substrate comprising--;

Column 18, Line 10, Claim 13, "buffer laver" should read --buffer layer--.

Signed and Sealed this
Nineteenth Day of August, 2025

Coke Morgan Stewart
*Acting Director of the United States Patent and Trademark Office*